United States Patent [19]

London

[11] 4,064,523
[45] Dec. 20, 1977

[54] HIGH-VOLTAGE BIPOLAR TRANSISTOR FOR INTEGRATED CIRCUITS

[75] Inventor: Arnold London, Tempe, Ariz.

[73] Assignee: Motorola, Inc., Chicago, Ill.

[21] Appl. No.: 663,406

[22] Filed: Mar. 3, 1976

[51] Int. Cl.$^2$ .............................................. H01L 29/06
[52] U.S. Cl. ........................................ 357/20; 357/34; 357/53
[58] Field of Search .................. 357/48, 53, 13, 20, 357/34

[56] References Cited
U.S. PATENT DOCUMENTS 3,836,998  9/1974  Kocsis et al. ........................... 357/53

OTHER PUBLICATIONS

Camenzind et al., "IC's Break Through the Voltage Barrier", Electronics, Mar. 31, 1969, pp. 90-95.

Primary Examiner—Stanley D. Miller, Jr.
Assistant Examiner—James W. Davie
Attorney, Agent, or Firm—Lowell E. Clark

[57] ABSTRACT

Combined junction and metallization morphology for achieving high-voltage capability in a shallow integrated bipolar transistor. The improvement comprises closely spaced emitter and base metallization in conjunction with a convexity in the surface portion of the collector-base p-n junction.

5 Claims, 3 Drawing Figures

HIGH-VOLTAGE BIPOLAR TRANSISTOR FOR INTEGRATED CIRCUITS

SUMMARY

Shallow p-n junctions tend to have breakdown voltage limited by radius of curvature. This problem is discussed for example in A. S. Grove, *Physics and Technology of Semiconductor Devices*, Wiley 1967, pp. 197-199 and 311-315.

The breakdown of such shallow diodes may be enhanced by conductive overlay of the external high resistivity side of the junction to a distance of approximately one depletion spread at breakdown, as discussed for example in "Design Considerations for High-Voltage Overlay Annular Diodes," D. S. Zoroglu and L. E. Clark, *IEEE Transactions on Electron Device ED*-19, Jan. 1972, pp. 4-8. In an integrated transistor where both emitter and base contacts must cross the collector-base junction, conductive overlay of the collector-base junction is precluded at the interspace between the contacts, thus limiting the desired voltage enhancement. In the present invention, the deleterious effects on the breakdown voltage of the collector-base junction are counteracted by close spacing of the contact metals and shaping of the surface portion of the p-n junction in order to enhance the depletion spread in the contact interspace.

THE DRAWINGS

DESCRIPTION

Figure 1:
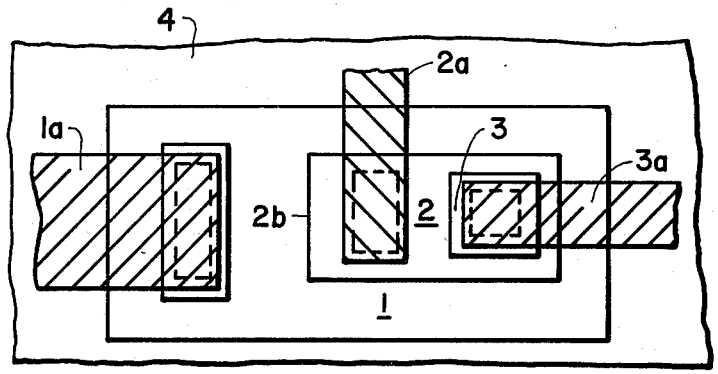
FIG. 1 is a top view of a typical integrated bipolar transistor according to known techniques.

FIG. 1 depicts a portion of a typical oxide-passivated integrated circuit showing especially a bipolar transistor structure. Region 4 is the isolation region which surrounds collector region 1 of opposite conductivity type on all sides (as well as the bottom in junction isolated integrated circuits). Region 2 is a base of opposite conductivity type to collector 1, and partially penetrates region 1. Region 3 is an emitter of same conductivity type as the collector 1; the emitter partially penetrates region 2.

Since the collector region 1 is of higher resistivity than base region 2, depletion spread is primarily into region 1 under reverse bias conditions. However, for collector-base voltages in excess of 100 volts, depletion spreads in excess of 5 microns are required; since base region 2 usually penetrates collector region 1 substantially less than 5 microns, there is considerable field concentration associated with the surface portion 2b of the collector base junction. Base contact metallization 2a and emitter contact metallization 3a extend over a thin (approximately 1 micron) insulating layer which covers collector-base junction portion 2b to make connections with other components in the integrated circuit. Since conductors 2a and 3a have nearly equal potentials in normal transistor operation, they act to extend the depletion where they overlie collector region 1. However, large portions of the surface junction region 2b are not covered by metal; breakdown will occur first in such regions. In particular, junction breakdown occurs first at the four corners of the collector-base junction, that is, the junction curvature is greatest here because of the combined effects of the shallow penetration of collector region 1 by base region 2 and the sharp corners in the plane of the surface.

Figure 2:
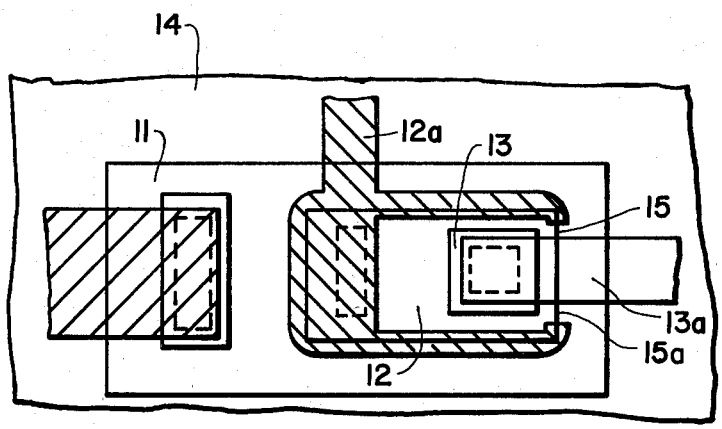
FIG. 2 is a top view of an improved transistor according to the present invention.

FIG. 2 shows an improved version of a high-voltage integrated transistor. Base metal 12a connected to base region 12 extends over all the corners of the base-collector junction and is closely spaced from the emitter metal 13a connected to emitter 13. The spacing of the contact metals along portions 15a of the collector base junction should be as close as possible and certainly not more than 15 microns. Note that it is not necessary that the base metal itself overlap the collector region at all the corners but that either the base or emitter metallization in combination overlap all the corners over the insulator covering the collector-base junction. The overlap along the entire periphery of the junction should be at least the expected depletion spread at breakdown, though any amount of overlap will serve to enhance the breakdown voltage.

Figure 3:
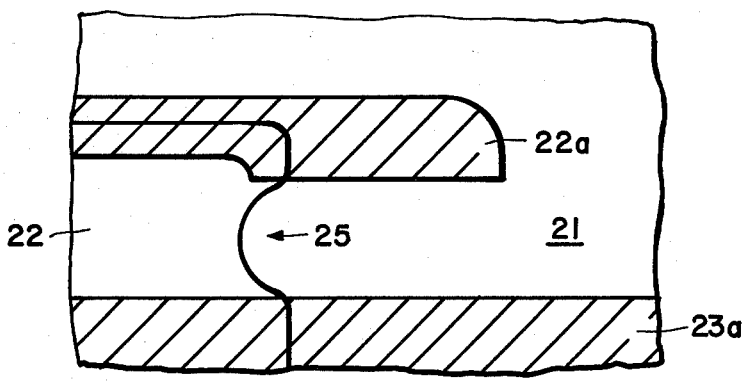
FIG. 3 is an enlarged view of the critical portion of a structure like that of FIG. 2 and showing an additional feature of the present invention.

FIG. 3 shows an additional improvement for enhancing the breakdown voltage. Here is shown an expanded view of the junction region between the emitter and base metallizations 23a and 22a. Surface junction regions 25 in the interspaces between conductors 22a and 23a are made to be convex away from the high-resistivity collector region 21.

Because the base 22 surrounds the portion of the collector region near the junction portion 25, the depletion spread into the collector is greater than if the collector base junction were straight, e.g., portions 15 in FIG. 2. Since the conductors 22a and 23a also flank the collector region in the vicinity of the junction portions 25, the depletion is spread even further, thus reducing the peak field and enhancing the breakdown voltage. The convexity of the junction away from the collector region 21 in the conductor interspace thus tends to compensate for the lack of metallic overlay of the collector region opposite junction portions 25. Such convexity is desirably commensurate with the interspace dimension, i.e., the radius of the convexity is approximately one-half of the metal spacing.

Although the convexity shown is semicircular, other convenient shapes would produce the desired effect.

While the invention has been particularly described with respect to a simple transistor, the principle applies to other geometries. For example, a multiple emitter transistor could be fabricated as long as the collector-base junction were covered by one of the several emitter or base metallizations except at dimensionally limited interspaces where convexities may be employed.

What is claimed is:

1. A high-voltage semiconductor device comprising:
   a semiconductor body having a surface;
   a first region of one conductivity type at said surface;
   a second region of second conductivity type surrounding said first region to form a PN junction at said surface, said second region having a higher resistivity than said first region at said surface;
   an insulator covering said PN junction and extending over said second region;
   at least two closely-spaced conductive means on said insulator over first and second portions, respectively, of said junction and extending over said second region; and
   at least a third portion of said junction between said closely-spaced conductive means; said third portion of said junction being convex away from said second region.

2. The device of claim 1 where the distance between the conductive means at said junction is everywhere within 15 microns.

3. The device of claim 1 where said first region is the base and one of said two closely-spaced conductive means is the base contact of a bipolar transistor.

4. The device of claim 1 further including a third region of second conductivity type in said first region.

5. The device of claim 4 where the first region is the base and the third region is the emitter of a bipolar transistor, and the two closely-spaced conductive means are the emitter and base contacts of said transistor.

* * * * *